United States Patent [19]

Frye et al.

[11] 4,380,865
[45] Apr. 26, 1983

[54] METHOD OF FORMING DIELECTRICALLY ISOLATED SILICON SEMICONDUCTOR MATERIALS UTILIZING POROUS SILICON FORMATION

[75] Inventors: Robert C. Frye, Piscataway; Harry J. Leamy, Summit, both of N.J.

[73] Assignee: Bell Telephone Laboratories, Incorporated, Murray Hill, N.J.

[21] Appl. No.: 321,263

[22] Filed: Nov. 13, 1981

[51] Int. Cl.³ .................. H01L 21/76; H01L 21/20
[52] U.S. Cl. ........................... 29/576 W; 29/576 E; 29/577 C; 29/578; 29/580; 148/1.5; 148/175; 156/603; 156/612; 156/628; 204/32 S; 204/129.1; 204/129.3; 357/49; 357/50; 357/55
[58] Field of Search ............ 29/576 W, 576 E, 577 C, 29/578, 580; 148/175, 1.5; 156/603, 612, 628; 204/32 S, 129.1, 129.3; 357/49, 50, 55

[56] References Cited

U.S. PATENT DOCUMENTS

| | | | |
|---|---|---|---|
| 3,640,806 | 2/1972 | Watanabe et al. | 204/32 S X |
| 3,919,060 | 11/1975 | Pogge et al. | 204/129.3 |
| 3,954,523 | 5/1976 | Magdo et al. | 148/175 |
| 4,057,823 | 11/1977 | Burkhardt et al. | 357/49 X |
| 4,234,358 | 11/1980 | Celler et al. | 148/1.5 |

OTHER PUBLICATIONS

Watanable et al., "Formation and Properties of Porous Silicon and its Applications" J. Electrochem. Soc., vol. 122, No. 10, Oct. 1975, pp. 1351-1355.
Arita et al., "Formation and Properties of Porous Silicon Film" Ibid, vol. 124, No. 2, Feb. 1977, pp. 285-295.
Bean et al., "Dielectric Isolation . . . "Ibid, vol. 124, No. 1, Jan. 1977, pp. 5C-12C.
Imai, Solid-State Electronics, vol. 24, 1981, p. 159.

Primary Examiner—L. Dewayne Rutledge
Assistant Examiner—W. G. Saba
Attorney, Agent, or Firm—Bruce S. Schneider

[57] ABSTRACT

Dielectrically isolated areas of single crystalline silicon suitable for use in device applications have been produced utilizing a particular processing sequence. This sequence first involves producing an area of porous silicon on a silicon substrate. A single crystal region of silicon is then formed on the porous silicon through procedures such as molecular beam epitaxy, chemical vapor deposition or laser fusion. The region of the porous silicon under the single crystal silicon is then oxidized in a specifically controlled manner to form an insulator.

11 Claims, 13 Drawing Figures

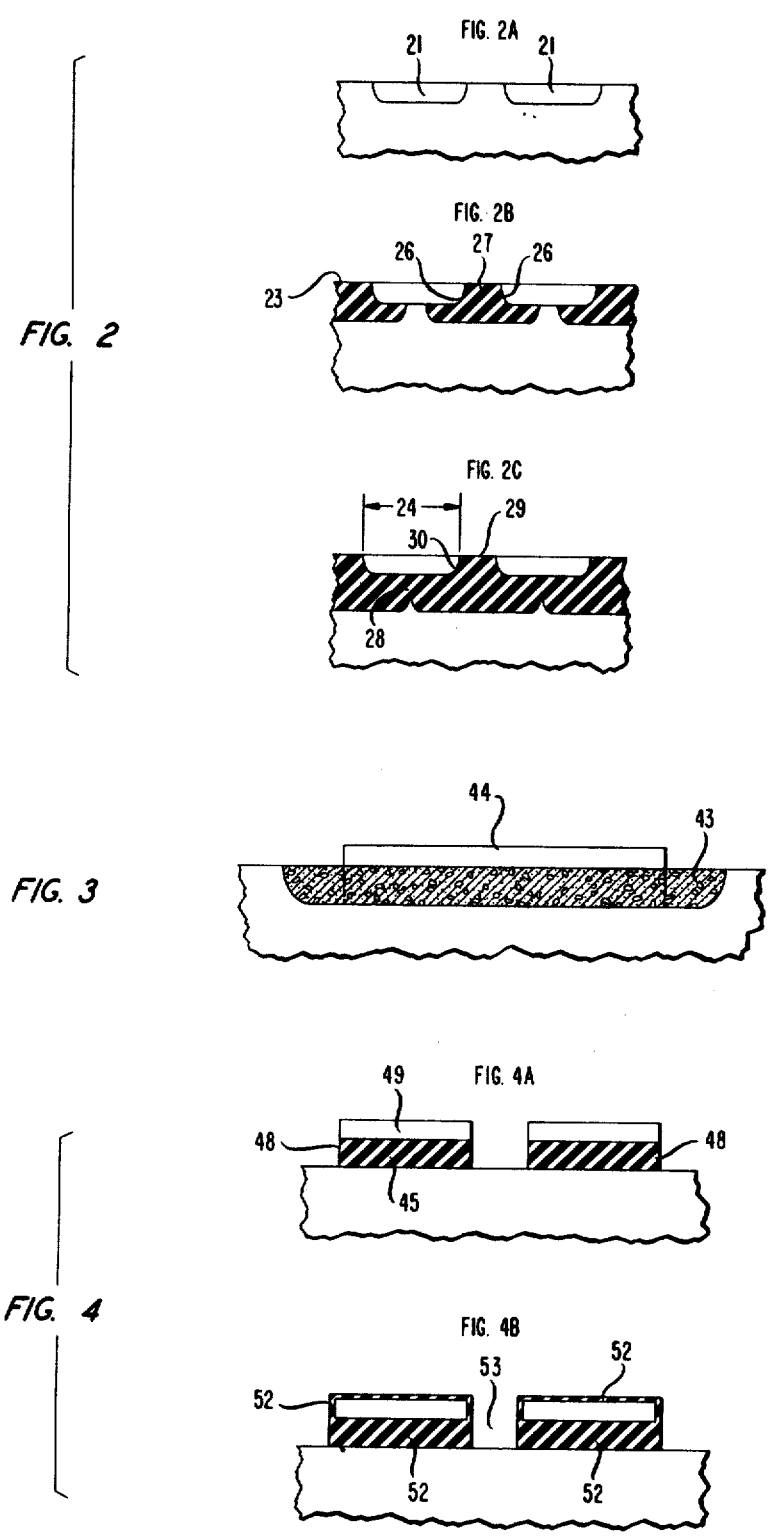

METHOD OF FORMING DIELECTRICALLY ISOLATED SILICON SEMICONDUCTOR MATERIALS UTILIZING POROUS SILICON FORMATION

BACKGROUND OF THE INVENTION

1. Field of the Invention

This invention relates to electronic device fabrication and more particularly to electronic device fabrication involving silicon.

2. Art Background

In most electronic components, such as integrated circuits, lateral separation is produced between regions of essentially single crystal silicon, i.e., silicon having less than a total of $10^8$ cm$^{-2}$ defects, e.g., linear and planar defects such as dislocations or stacking faults, respectively. This separation is accomplished by interposing between the single crystal silicon regions, a region of electrically insulating material having a thickness approximately equal to the depth of the active regions of the single crystal materials being separated. (The active region is that portion of the single crystal silicon which is modified to contain electronic device structures. The active region is typically 1 μm thick for nominal voltage devices.) In this manner, transistors or other devices formed in one single crystal region, i.e., one active region, are electrically isolated and are prevented from interacting with devices in a second active region.

However, for some significant applications the use of lateral isolation alone is not sufficient. For example, in some instances, the voltage employed in operation is often large enough to cause interaction between separate active regions. This interaction occurs by the penetration of charge carriers below one active region through the underlying substrate, across the substrate under the lateral isolation region, and up into the second active region. To prevent such undesirable electrical interaction between two active regions, vertical electrical isolation, in addition to lateral isolation, is employed. Vertical isolation is provided by underlying some, or most commonly all, of the single crystal silicon regions with a region of electrically insulating material. By this expedient, interaction between active regions even at high voltages is avoided.

Vertical isolation is also advantageously used in devices operating at nominal voltages where enhanced reliability is desirable. The additional insulating material that provides vertical isolation also prevents electron-hole pairs formed in the underlying substrate by thermal processes or by ionizing radiation from migrating to an active region and, therefore, introducing errors in the processing of information by the electronic devices in this region. Additionally, the vertical isolation reduces capacitance and, thus, allows faster device operation.

A variety of processes have been employed to produce a component having both lateral and vertical isolation. For example, a dielectric isolation process is described by K. E. Bean and W. R. Runyon, *Journal of The Electrochemical Society*, 124(1), 5C (1977). This process involves the use of a silicon substrate having a very low defect density. The silicon substrate is coated with an insulating material, such as silicon oxide, 3, and holes, 5, are formed in the oxide by conventional techniques, e.g., photolithography followed by chemical etching. Grooves, 7, are then etched in the exposed portions of the silicon underlying the holes in the dielectric material. These grooves, 7, are epitaxially coated with a layer of N+ silicon, 8. The n+ silicon is, in turn, coated with an insulator, 9, such as silicon oxide. The insulator is once again, in turn, coated with a layer of polysilicon, 10. The structure produced is denominated 1F in FIG. 1. The entire structure is then inverted, the silicon substrate is ground off until the structure shown at 1G is obtained. In this structure, the remaining high quality silicon is denoted by 12, insulating layers are indicated by 14 and 15, and polysilicon is indicated by 16. Thus, the final structure has single crystal silicon, 12, on an electrically insulating material.

Although this dielectric vertical isolation process has been used, it has certain shortcomings. During the processing, as the silicon oxide layer, 9, is grown, an extreme amount of compressive stress develops in the apex area, 17, of the silicon oxide layer, 9. This stress exerts a concomitant force on the adjacent single crystal silicon, 12, which results in extensive defect formation. Thus, the quality of the single crystal silicon region is significantly degraded.

Other attempts to produce a vertically isolated region of single crystal silicon have involved the use of porous silicon. (See Yoshinobu and Sunohara, *Journal of the Electrochemical Society: Solid-State Science and Technology*, 124(2), 285 (1977) for a description of porous silicon and its manufacture.) For example, in a representative procedure described by Imai in *Solid-State Electronics*, 24, 159 (1981), islands, 21 in FIG. 2, of n-type single crystal silicon are produced in a p-type silicon substrate by conventional techniques such as ion implantation. The substrate is then treated electrolytically in an aqueous HF solution under conditions which convert p-type silicon to porous silicon but leave n-type silicon essentially untouched. The porous silicon formation starts at the surface, 23, and progresses as shown at 2B in FIG. 2, until the porous silicon formation fronts join to produce the structures shown at 2C. The porous silicon typically is formed to a depth greater than half the lateral span, 24, of the n-type island—typical are 15 μm lateral spans and approximately 8 μm depths of porous silicon. The porous silicon is then oxidized to form a silicon oxide insulating region by subjecting the porous silicon to a temperature of about 950 degrees C. for 400 minutes in a wet oxygen ambient. Since the silicon oxide region extends vertically into the substrate to a substantial depth, vertical isolation is achieved. However, when the porous silicon region is formed, the current density during the electrolytic process at the edges, 26, of the n-type region is significantly greater than the current density in the central area, 27, of the porous silicon between n-type islands. The non-uniformity in current density produces an associated spatial non-uniformity in the density of the porous silicon. (See Arita and Sunohara supra.) When the resulting porous silicon is oxidized, the denser regions, 28 and 29, swell while the less dense regions, 30, collapse. This swelling in one region and contraction in another causes significant strain in the adjacent single crystal silicon with its attendant problems.

SUMMARY OF THE INVENTION

Through the use of the inventive process, vertical isolation of single crystal regions of silicon that are significantly larger than previously reported is possible without introducing excessive strain into these regions. A substrate composed of either n or p-type silicon is employed. Large regions of the substrate surface are converted into porous silicon. Before the vertically isolating regions are fabricated, single crystal regions are formed on the porous silicon and each single crystal region is confined within the ambit of a porous silicon region through a process including conventional epitaxial growth techniques. The porous silicon underlying the single crystal regions is then converted into insulating material by oxidation. The conversion process is begun at the exposed region of the porous silicon and continues under the single crystal silicon region until substantially all the porous silicon underlying the single crystal silicon is reached. The lateral oxidation is accomplished by initially employing a relatively low oxidation rate and then gradually and substantially increasing this rate. The single crystal silicon region overlies a central region of porous silicon whose density is essentially constant. When the porous silicon is oxidized dimensional changes are controllable. Therefore, defects in the single crystal silicon region induced by strain are essentially avoided.

BRIEF DESCRIPTION OF THE DRAWINGS

FIGS. 1A–G and 2A–C are processes relating to dielectric isolation; and

FIGS. 3 and 4A–B are illustrative of the inventive isolation technique.

DETAILED DESCRIPTION

Figure 1:
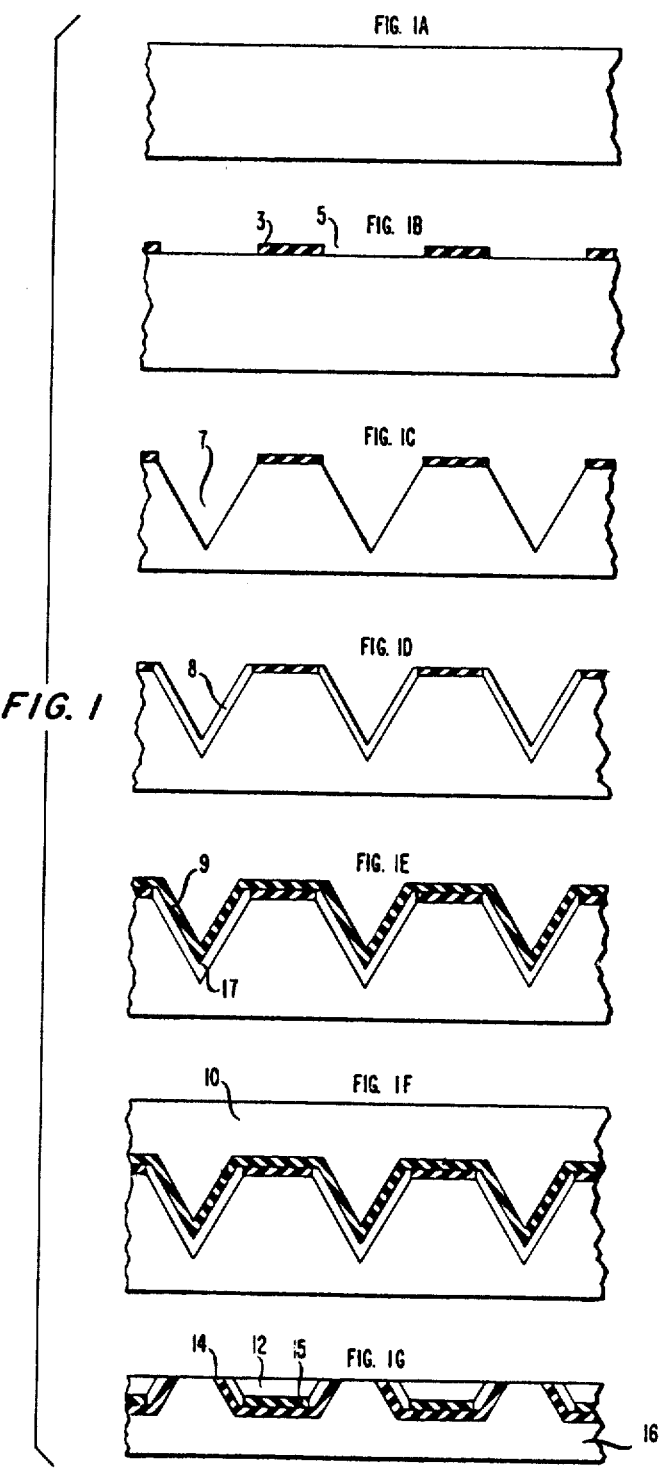

The inventive process is advantageously practiced on a substrate of silicon. (Both n and p-type silicon are useful). The regions of the substrate upon which the dielectrically isolated single crystal silicon regions will ultimately be built are treated to produce a porous silicon area having a thickness in the range 0.5 to 30 μm. The thickness employed depends on the final thickness that the region is to have when it is converted into an insulator. This final thickness, in turn, depends on the degree of insulation which is necessary. Typically, silicon oxide layers having a breakdown voltage in the range 200 to 5000 V are desired for high-voltage devices, i.e., devices operating in the voltage range 100 to 1000 V. These breakdown voltages are achieved by employing an oxide thickness generally greater than 1 μm of a high quality oxide such as produced by the procedure described infra. For applications such as nominal voltage circuitry the breakdown voltage is not as important and silicon oxide layers having thicknesses typically in the range 0.5 μm to 10 μm are suitable to yield the desired properties. In any case, the oxide layer should have a thickness of at least 1000 Å.

It is desirable that the portion of the porous silicon region, 43 in FIG. 3, which the single crystal silicon, 44, overlies be of essentially uniform density, i.e., the density in the volume of porous silicon beneath the region, 44, to a depth adequate to yield the desired breakdown voltage, or in the case of low-voltage devices, the improved properties, should have a density that does not vary more than 10 percent preferably 5 percent, most preferably 2 percent. (The underlying porous silicon is defined by imaginary planes shown by dotted lines in FIG. 3 perpendicular to the substrate surface that intersects the lines defining the extremities of the single crystal region.)

The density criterion is advantageously satisfied simply by converting the entire surface of the silicon substrate to porous silicon. (Because of practical considerations the very edge of the substrate is generally concealed during electrolyte porous silicon formation by a fixture designed to hold the substrate in the electrolyte. Thus, a small concealed area is generally not made porous. However, it is within the scope of the invention to treat the entire substrate.) Only the porous silicon in proximity to the edges of the region made porous, e.g., within 1 mm of the edge, is subjected to a current density different from the remainder of the substrate during electrolytic porous silicon formation. Thus, except for a very limited area at the periphery of the substrate, uniform material density is achieved. To satisfy the density requirement it is only necessary to produce the single crystal region over porous silicon that is not in the periphery areas.

Despite the simplicity of converting the entire substrate surface into porous silicon, it is possible to convert regions less than the entire surface but significantly larger than a single overlying region of single crystal silicon. As with the porous silicon formed over the entire substrate, at the extremities of the porous silicon region some density gradient is produced. (The lateral distance that the density gradient includes depends on the physical dimension of the adjoining non-porous silicon regions. The density gradient in a porous silicon region is easily observed by optical inspection and this region should not be overlaid. For example, at the extremities of a substrate with a one-half centimeter non-porous silicon border the gradient region extends a lateral distance of approximately 1 mm from the extremities of the porous silicon.) In an advantageous embodiment the single crystal silicon regions are produced by first forming a layer of single crystal silicon over essentially the entire surface of the substrate. Appropriate portions of the single crystal silicon layer are then removed by conventional techniques, e.g., chemical or plasma etching combined with the appropriate lithography to yield the disjoint desired single crystal silicon regions which are in appropriate spatial relation to the porous silicon regions.

The procedure for producing porous silicon in both p-type and n-type silicon has been described in Y. Watanabe et al., *Journal of the Electrochemical Society: Solid-State Science and Technology*, 122(10), 1351 (1975). Basically, this procedure involves immersing in a HF based electrolyte a counterelectrode and the n or p-type silicon substrate with the areas to be made porous exposed to the electrolyte. A current is then passed from the silicon substrate to the counterelectrode. The current density and the substrate resistivity employed determine the density of the porous silicon attained. Typically, current densities in the range 0.1 mA/cm$^3$ to 200 mA/cm$^2$ for substrates having a resistivity in the range 500 to 0.005 ohm/cm, produce material densities in the range 0.7 gm/cm$^3$ to 1.6 gm/cm$^3$. (For high resistivity n-type substrates, as described in Watanabe supra, the substrate is illuminated during the electrolytic etch.) A control sample is employed to determine a suitable current density to obtain a desired material density when converting a substrate of a given resistivity. (The substrate resistivity is controllable by adjusting the silicon doping level.)

Material densities in the range 0.7 to 1.6 gm/cm$^3$ produce porous silicon that is convertible into useful silicon oxide regions. However, for demanding applications, such as high-voltage circuits, it is preferable to employ porous silicon having a density in the range 0.9 to 1.1 gm/cm$^3$. As the density decreases, the resulting silicon oxide produced has somewhat increased tensile strain and decreased breakdown voltage. Densities down to 0.7 gm/cm$^3$ remain useful, but below this value adhesion of the porous silicon to the substrate is undesirably low. As the density increases, compressive stress in the oxidized material increases. Materials having densities up to 1.6 gm/cm$^3$ are useful, but above this level it is generally not possible to induce oxidation across the entire lateral dimension of the porous silicon region that underlies a single crystal silicon region of typical lateral dimension.

After the porous silicon is formed, the desired single crystal silicon regions are fabricated. These regions are produced by well known techniques such as chemical vapor deposition (CVD), molecular beam epitaxy, or laser melting. Typical of chemical vapor deposition techniques is the use of a vertical hot-wall reactor with a vapor flow including silane and a hydrogen carrier. (See McDonald Robinson, Chapter 6, "CVD Doping of Silicon," of a volume entitled *Impurity Doping Processes in Silicon*, edited by F. F. Y. Wang, North Holland pub. New York (1981) pp. 258–314 for a description of this CVD process.) The deposition vapor is flowed over a substrate or substrates heated to a temperature in the range 900 to 1150 degrees C. Alternatively, a molecular beam epitaxy process, such as described in J. C. Beam, Chapter 4 "Growth of Doped Silicon Layers by Molecular Beam Epitaxy," of a volume entitled *Impurity Doping Processes in Silicon*, supra. with a substrate temperature in the range 650 to 1000 degrees C. is employed.

It is also possible to use a laser to melt regions of the porous silicon to produce regions of single crystal silicon. A pulsed laser having a pulse length of from 10 to 500 nanoseconds is advantageously employed. The laser power is set so that a thickness of porous silicon is melted that is approximately twice that of the thickness of the single crystal silicon to be produced. Through the melting and solidification process induced by the pulsed laser, a single crystal silicon region is formed. (See U.S. Pat. No. 4,234,358, which is hereby incorporated by reference, for a description of an equivalent process employed to produce single crystal silicon from highly defective silicon.) In the laser melting fabrication technique, the porous silicon region should be sufficiently thick so that after the laser fusion process a suitable thickness of porous silicon remains underlying the region of single crystal silicon.

After the single crystal silicon regions are formed, the porous silicon underlying the single crystal silicon is oxidized to form a vertically isolating region of insulating material. As previously discussed, it is advantageous to etch a layer of single crystal silicon to define the single crystal silicon regions. It is also advantageous to continue this etching process so that the porous silicon, 45, in area, 48, is exposed directly below the boundary of the single crystal silicon region, 49. Through this expedient the oxidizing medium more easily enters the extremities of the porous silicon material that underlie the single crystal silicon region.

A typical oxidizing medium useful in the subject process is $O_2$ or a mixture of $O_2$ and steam. (If desired, it is possible to mix a carrier gas with the oxidizing medium.) The conversion of the porous silicon to an insulator through oxidation processes should be performed so that the initially induced conversion occurs at a relatively slow rate and the conversion rate is then relatively slowly increased. If this procedure is not followed, the risk of sealing the extremities of the porous silicon region through the swelling of the initially converted material is significantly increased. (It is also advantageous to limit initially the partial pressure of $O_2$ or $O_2$ plus steam to 1 atm or less since at higher pressure oxidation generally occurs too rapidly.)

An advantageous method of producing the appropriate oxidation rate gradient in the conversion process involves the use initially of a temperature in the range of 500 to 600 degrees C. with an oxidizing agent, e.g., $O_2$ or $O_2$ and steam. The temperature is then increased gradually to a temperature in the range 1000 to 1250 degrees C. over a time period of from 15 minutes to 2 hours. The longer the time period employed during the temperature increase, the longer the lateral region across which it is possible to extend the oxidation of the porous silicon material. For example, the use of an $O_2$/steam medium with a time period of 15 minutes to treat a porous silicon region having a density of 1.1 gm/cm$^3$ yields an oxidized region with lateral dimension of from 70 $\mu$m to 150 $\mu$m. In contrast, the use of a time of 2 hours yields a dimension of from 200 $\mu$m to 400 $\mu$m. Both the time during which the temperature is increased and the initial density of the porous silicon region under the single crystal silicon region determine the maximum lateral dimension that is possible to oxidize. A controlled sample is employed to determine an appropriate density and time interval for a desired lateral dimension. A dry oxidizing agent, $O_2$, is better able to penetrate greater lateral distances under the single crystal silicon region. A wet oxidizing agent. $O_2$/steam, generally produces an oxide with a higher breakdown voltage. A combination of the two agents is possible, e.g., employing dry oxygen initially at low temperatures to obtain penetration and then wet oxygen at higher temperatures to improve oxide quality.

The oxidation of the underlying porous silicon yields configurations such as shown at 4B in FIG. 4. (The oxidized regions are denoted 52.) It should be noted that an oxide skin forms on the surface of the single crystal silicon region. This skin helps protect the single crystal surface until holes are etched in the skin during the process of forming devices in the single crystal silicon. Since the porous silicon has substantial voids before it is oxidized, the oxidation process does not lead to undesirable volume changes. Additionally, since the porous silicon in proximity to the single crystal region has a substantially uniform density, undesirable strain and thus defects are not introduced during the oxidation process. After the configuration in 4B is reached, it is desirable to planarize the surface by filling the voids, 53. (The filling of the voids also provides additional lateral isolation.) This is done by conventional techniques such as CVD oxide deposition and subsequent reactive ion etching to flatten the deposited oxide. (See A. C. Adams and C. D. Capio, *Journal of the Electrochemical Society,* 126, 1042 (1980) for a description of CVD oxide deposition and A. C. Adams and C. D. Capio, *Journal of the Electrochemical Society,* 128, 423 (1981) for a description or reactive ion flattening.) The entity obtained is then treated in a conventional manner to produce the desired electronic device elements, e.g., transistors, capacitors and/or resistors in the single crystal regions and to produce electrical contact to these devices.

The following examples illustrate typical conditions employed in the inventive process.

EXAMPLE 1

A (100) oriented, boron-doped, three-inch diameter wafer having a resistivity of 0.006 ohm/cm was placed in a substrate holder for electrolytic treatment. The substrate holder had two Teflon parts. The first part contained a well approximately one-half centimeter deep and about two and one-half inches in diameter. A port connected this well to the rim of this sample holder section. The substrate was placed on this section of the sample holder and positioned so that it was essentially centered over the well. A Teflon ring having an inside diameter of approximately two and one-half inches was centered over the wafer. This second sample holder part was wide enough so that it could be bolted into the first sample holder part at points beyond the edge of the substrate. Once these Teflon parts were bolted together with Teflon screws, the well behind the substrate was filled with distilled mercury through its outlet port.

An electrolyte was prepared by combining one part by volume of water with two parts by volume of an HF solution. (The HF solution was a 48 percent by weight solution of HF in water, i.e., concentrated HF.) The substrate holder with the substrate was immersed into the electrolyte so that the substrate was covered but the outlet port for the mercury projected above the surface of the electrolyte. A counterelectrode was provided by immersing a two-inch square sheet of platinum into the electrolyte. A tungsten lead was electrically connected to the positive terminal of the power supply and was inserted into the mercury so that it contacted the mercury in the well behind the substrate. An electrical conductor was electrically connected to the negative terminal of the power supply and was attached to the counterelectrode through a pressure contact. A total current of 1.6 amps (a current density of approximately 50 mA/cm$^2$) was passed between the substrate and the counterelectrode for a period of 2 minutes. The current flow was terminated, the sample holder was removed from the solution, and the substrate was rinsed in deionized water. The resulting porous silicon film across the exposed portion of the wafer was approximately 5 $\mu$m deep as observed in an optical microscope.

The substrate was then baked in a vacuum oven at a pressure of approximately 50 millitorr and a temperature of 200 degrees C. for approximately 30 minutes. This procedure was performed to remove any remaining electrolyte from the pores of the porous silicon. The substrate was then placed in a sample holder of a vertical, hot-wall chemical vapor deposition reactor. The reactor was heated to 1100 degrees C. and 1 atmosphere of hydrogen was introduced into the reactor. This treatment was continued for 10 minutes and then the hydrogen was removed from the sample chamber. The temperature was adjusted to 1000 degrees C. and a gas flow of 95 l/min of hydrogen and 150 sccm of silane was introduced into the chamber at approximately 1 atmosphere pressure. The flow of silane/hydrogen mixture was continued for approximately 10 minutes, the flow was terminated, and the residual silane-containing gas was evacuated from the chamber. This procedure resulted in an approximately one and one-half micron thick epitaxial film having a defect density of approximately 10$^4$/cm$^2$. (The defect density was measured using a conventional etchant and observing the resulting etch pits in a scanning electron microscope.)

Apiezon W wax (a product of the Apiezon Company) was dissolved in trichloroethane. Small drops of the solution were placed on the substrate at intervals to form beads having a diameter of approximately 3 to 4 mm. The substrate was left in the ambient to allow the trichloroethane to evaporate. The evaporation of the trichloroethane left areas of Apiezon W wax of approximately 3 to 4 mm in diameter.

A silicon etch was prepared by combining one part by volume concentrated nitric acid, one part by volume concentrated hydrochloric acid and six parts by volume glacial acetic acid. The substrate was immersed into the etchant and was kept in the etchant until the unmasked portions of single crystal silicon and the porous silicon underlying these portions had been removed. (The termination of the removal process is easily observed by a change in the reflectivity of the substrate regions being etched. The whole etching process took approximately 10 seconds.) The substrate was rinsed in deionized water and the wax was removed using trichloroethane.

The substrate was placed in a furnance at 600 degrees C. An oxygen flow was initiated through a water bubbler held at 90 degrees C. The resulting water saturated oxygen was then flowed through the furnace over the substrate. As soon as the oxygen flow was initiated, the temperature was increased linearly at a rate of 20 degrees C. per minute. The temperature was increased until 1000 degrees C. was reached and this temperature was maintained for 45 minutes.

The samples were cleaved through the islands so that they could be optically inspected. The lateral penetration of the oxidation under the single crystal silicon region was observed to be from approximately 70 to 150 $\mu$m.

EXAMPLE 2

The same procedure was followed as described in Example 1 except during the oxidation process the temperature was increased from 600 degrees C. to 1000 degrees C. at a linear rate of 3 degrees per minute. This procedure resulted in lateral penetrations of 200 to 400 $\mu$m.

EXAMPLE 3

The procedure of Example 1 was followed except a variety of substrate temperatures in the CVD process were employed. These temperatures ranged from 900 to 1100 degrees C. Additionally, silicon tetrachloride was used instead of silane. The resulting single crystal silicon was of approximately the same quality as that described in Example 1.

EXAMPLE 4

The procedure of Example 1 was followed except the single crystal silicon was grown by a molecular beam epitaxy procedure. The substrate was placed in the sample holder of a molecular beam epitaxy apparatus. The sample chamber was evacuated to a pressure of approximately 5×10$^{-9}$ Torr. The substrate was then rapidly heated to a temperature of 850 degrees C. The surface of the substrate was sputter etched with argon ions to clean the surface by removal of between 100 to 1000 Å of material. The substrate temperature was lowered to 650 degrees C. A reservoir of pure silicon was heated with an electron beam to produce a flux of silicon directed at the substrate. The flux was allowed to impinge on the substrate for a period of 15 minutes resulting in a single crystal silicon thickness of approximately 1 $\mu$m. The defect density at the surface of the single crystal silicon was essentially zero and this defect density progressed to a level of approximately 10$^5$/cm$^2$ at the interface with the porous silicon material.

EXAMPLE 5

The procedure of Example 1 was followed except single crystal silicon regions were produced by laser melting. The substrate was placed on a heated sample holder at 350 degrees C. A frequency doubled neodymium-YAG laser operating in a single, Gaussian output mode at a wavelength of approximately 0.53 micron was employed. The laser was modulated at 250 kHz with pulse length of approximately 95 nanoseconds. A spot size of approximately 40 μm with an average power at the substrate surface of approximately 25 1milliwatts was scanned over the surface of the substrate so that each dot in sequence overlapped the previous dot by approximately 30 μm. The laser was scanned in a serpentine pattern until an area of approximately 10 cm$^2$ had been completely treated by the melting induced by the laser. The single crystal region was examined by electron channeling, and the extent of channeling indicated that a single crystal region was in fact formed.

What is claimed is:

1. A process for producing a vertically isolated region of single crystal silicon comprising the steps of (1) forming a region of porous silicon that is larger in area than said region of single crystal silicon, (2) forming said region of single crystal silicon within the boundaries of said region of porous silicon such that said region of single crystal silicon overlies a section of said region of porous silicon and (3) subjecting said section to oxidation to produce said vertical isolation wherein said section has a density which varies less than 10 percent over its area and to a depth of at least 1000 A.

2. The process of claim 1 wherein said region of single crystal silicon is formed by a chemical vapor deposition process.

3. The process of claim 2 wherein said chemical vapor deposition process employs a gas flow containing silane.

4. The process of claim 1 wherein said region of single crystal silicon is formed by a molecular beam epitaxy process.

5. The process of claim 1 wherein said region of single crystal silicon is formed by laser melting of a portion of said region of porous silicon.

6. The process of claim 1 wherein said region of porous silicon is formed in a silicon wafer.

7. The process of claim 1 wherein said oxidation is accomplished by employing an oxidizing agent comprising oxygen.

8. The process of claim 7 wherein said oxidizing agent includes steam.

9. The process of claim 7 wherein the oxidation is initiated at a temperature in the range of 500 to 600 degrees C.

10. The process of claim 9 wherein said temperature is increased during said oxidation to a temperature in the range of 1000 to 1250 degrees C.

11. The process of either claim 1, 2, 3, 4, 5, 6, 7, 8, 9 or 10 including the step of producing an electronic device in said region of single crystal silicon.

* * * * *